US009742379B2

(12) United States Patent
Goeke

(10) Patent No.: US 9,742,379 B2
(45) Date of Patent: Aug. 22, 2017

(54) VOLTAGE CLAMP

(71) Applicant: Keithley Instruments, LLC, Solon, OH (US)

(72) Inventor: Wayne C. Goeke, Hudson, OH (US)

(73) Assignee: Keithley Instruments, LLC, Solon, OH (US)

( * ) Notice: Subject to any disclaimer, the term of this patent is extended or adjusted under 35 U.S.C. 154(b) by 109 days.

(21) Appl. No.: 14/566,534

(22) Filed: Dec. 10, 2014

(65) Prior Publication Data

US 2016/0149560 A1    May 26, 2016

Related U.S. Application Data

(60) Provisional application No. 62/082,841, filed on Nov. 21, 2014.

(51) Int. Cl.
| | |
|---|---|
| *H03K 5/08* | (2006.01) |
| *H03K 3/01* | (2006.01) |
| *G01R 1/36* | (2006.01) |
| *H02H 9/04* | (2006.01) |

(52) U.S. Cl.
CPC .............. *H03K 3/01* (2013.01); *G01R 1/36* (2013.01); *H02H 9/04* (2013.01)

(58) Field of Classification Search
CPC ............. H03K 3/01; G01R 1/36; H02H 9/04
USPC ........................................................ 327/318
See application file for complete search history.

(56) References Cited

U.S. PATENT DOCUMENTS

| | | | | |
|---|---|---|---|---|
| 5,337,205 A * | 8/1994 | Haun | ............... | H02H 1/066 361/18 |
| 5,384,532 A * | 1/1995 | Uhling | ............... | G01R 1/06766 324/72.5 |
| 5,995,166 A * | 11/1999 | Kawano | ............... | H04N 5/18 348/689 |
| 6,717,450 B1 * | 4/2004 | Linder | ............... | G01R 31/2834 327/321 |
| 2007/0023840 A1 * | 2/2007 | Hynes | ............... | H01L 27/0285 257/355 |
| 2007/0216391 A1 * | 9/2007 | Blanken | ............... | H02M 3/33507 323/351 |
| 2009/0086395 A1 * | 4/2009 | Skrenes | ............... | H03K 5/08 361/91.2 |
| 2012/0253776 A1 * | 10/2012 | Takizawa | ............... | G06F 17/5036 703/14 |

(Continued)

FOREIGN PATENT DOCUMENTS

EP        1832888 A1     9/2007

OTHER PUBLICATIONS

Extended European Search Report for Application No. 15195715.6, dated Mar. 5, 2016, 10 pages.

*Primary Examiner* — Ryan Jager
(74) *Attorney, Agent, or Firm* — Marger Johnson

(57) ABSTRACT

A voltage clamp circuit which operates using a voltage controlled current source where the change of the polarity of the voltage controlled current source controls whether it is clamping or not. While clamping, the stability of the control loop uses the capacitance of the output to create and single pole roll-off of the loop gain and while not clamping, uses the capacitance of the circuit which sets the clamping voltage to produce the roll-off. The circuit operates in a linear fashion both while clamping and not clamping, which allows for a faster response when clamping is needed.

13 Claims, 3 Drawing Sheets

(56) References Cited

U.S. PATENT DOCUMENTS

2013/0049783 A1\* 2/2013 Driesen .............. G01R 31/2621
324/755.01

\* cited by examiner

VOLTAGE CLAMP

CROSS-REFERENCE TO RELATED APPLICATION

This application claims the benefit of U.S. Provisional Patent Application No. 62/082,841, titled VOLTAGE CLAMP and filed on Nov. 21, 2014.

TECHNICAL FIELD

This disclosure relates generally to voltage clamps and, more particularly, to voltage clamps designed for dry circuit ohms clamping.

DETAILED DESCRIPTION

Dry circuit resistance generally requires a sourcing circuit that limits the maximum applied voltage across the device under test (DUT) to less than a few tens of millivolts (e.g., 20 mV to 30 mV). This is typically needed to prevent the breaking down of a thin oxide that can form on electrical contacts within the DUT, such as a relay contact or a contact within a connector pair.

Embodiments of the disclosed technology are generally directed to a circuit having a maximum voltage limit and a maximum current limit. The circuit may include a first current source configured to drive the output of the circuit (i.e., by setting the maximum current) and a second current source having a polarity that is opposite the polarity of the first current source, and is coupled with a resistance.

A voltage-controlled current source may be configured to, when its current has a polarity opposite that of the first current source, remove current from the output and, when its current has a polarity that is opposite that of the second current source, remove current from the node common to the second current source and the resistance, thus reducing the current through the resistance;

The circuit may include a component configured to compare the output voltage to the voltage across the resistance and drive the voltage controlled current source's input such than there is a negative feedback.

The circuit may include a first capacitance added to the output of the circuit to provide a single pole roll off of the output voltage from the input to the voltage controlled current source. The circuit may also include a second capacitance added across the resistance to provide a single pole roll off of the voltage across the resistance from the input to the voltage controlled current source.

Figure 1:
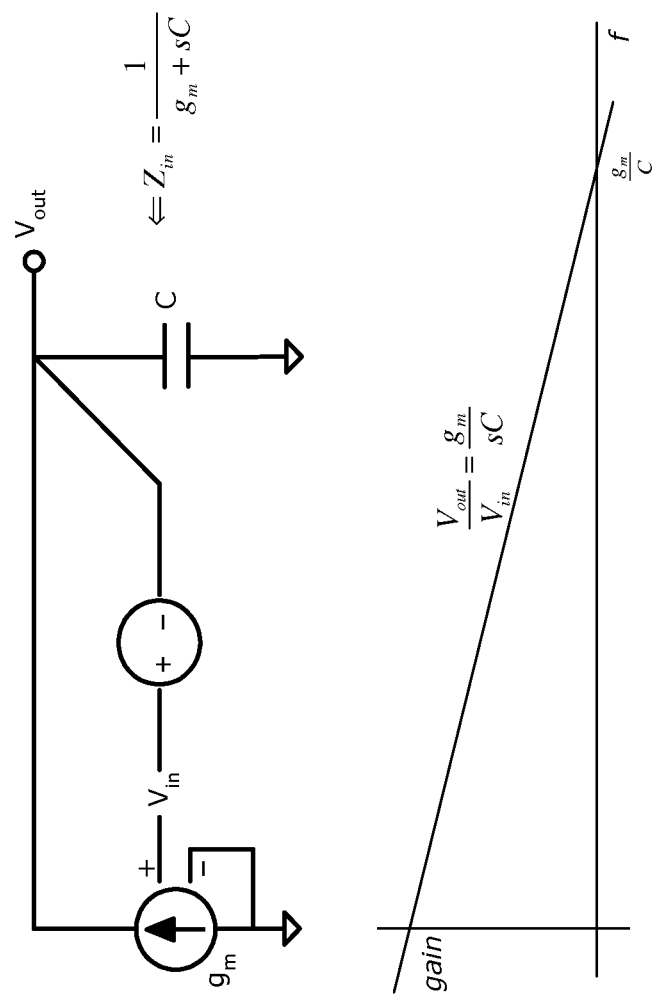
FIG. 1 illustrates an example of a loop concept circuit on which certain voltage clamp design embodiments in accordance with the disclosed technology are based.

FIG. 1 illustrates an example of a loop concept circuit 100 on which certain voltage clamp design embodiments in accordance with the disclosed technology are based. In the example 100, a capacitor C causes a 20 dB/dec roll-off where $g_m/c$ represents the gain-bandwidth of the circuit. The current source $g_m$ should have a constant gain for frequencies less than or equal to $g_m/c$.

Figure 2:
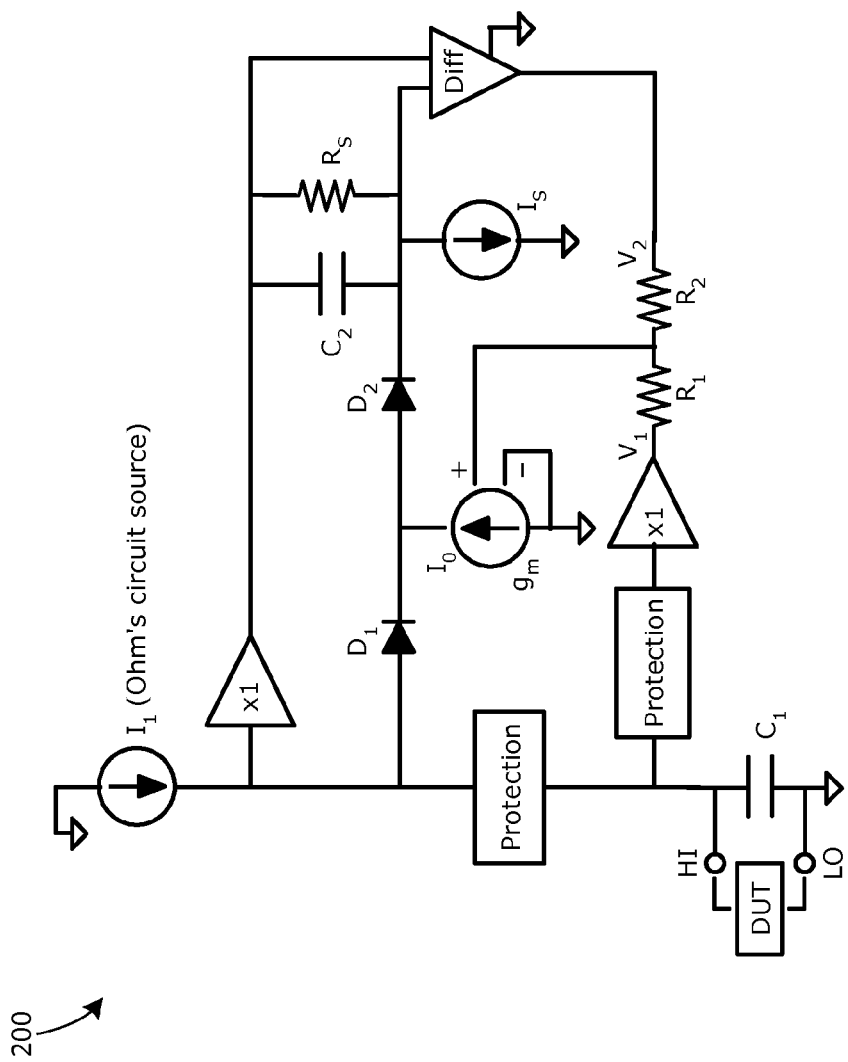
FIG. 2 is a block diagram illustrating an example of a voltage clamp circuit coupled with a device under test (DUT) in accordance with certain embodiments of the disclosed technology.

FIG. 2 is a block diagram illustrating an example of a voltage clamp circuit 200 coupled with a DUT in accordance with certain embodiments of the disclosed technology. In the example, a current source $I_0$ is steered by the two diodes $D_1$ and $D_2$ to regulate the voltage on one of two capacitors $C_1$ or $C_2$. When the $I_0$ current is negative, the Ohm's current source $I_1$ is diverted through the first diode $D_1$, thus reducing the current flowing to the HI connection.

When the $I_0$ current is positive, however, the Is current source is supplied through the second diode $D_2$, thus reducing the current flowing through a source resistor $R_s$. The loop circuit 200 generally either regulates $V_2/R_2$ to be equal to $-V_z/R_z$ (i.e., with the first diode $D_1$ conducting) or regulates $V_z/R_z$ to be equal to $-V_2/R_2$ (i.e., with the second diode $D_2$ conducting).

In the example 200, a voltage $V_1$ may be clamped to $R_z/R_2 R_S I_S$. Thus, $R_2/R_z R_S I_S$ generally needs to be set between 20 mV and 30 mV to meet the needs for dry circuit testing. The loop bandwidth is $g_m/C_2$ when $D_1$ is conducting and switches to $g_m/C_2$ when $D_2$ is conducting.

The ohm's current source protection will generally drop voltage when current is flowing through it. Therefore, the capacitor $C_2$ and source resistor $R_s$ may be bootstrapped to follow the ohm's current source's voltage. This advantageously prevents both of the diodes $D_1$ and $D_2$ from turning on at the same time. A differential stage, Diff, may be used to translate the voltage across the source resistor $R_s$ to ground to be mixed against the voltage $V_1$.

In the example 200, the first capacitor $C_1$ is used to limit the rate that the voltage $V_1$ rises when a conduction path (e.g., the DUT) between the HI and LO connections is suddenly removed, e.g., to minimize the overshoot. Using the capacitance—$g_m$ interaction to control stability generally avoids problems that the capacitance may present in situations where a normal voltage source loop is used.

Figure 3:
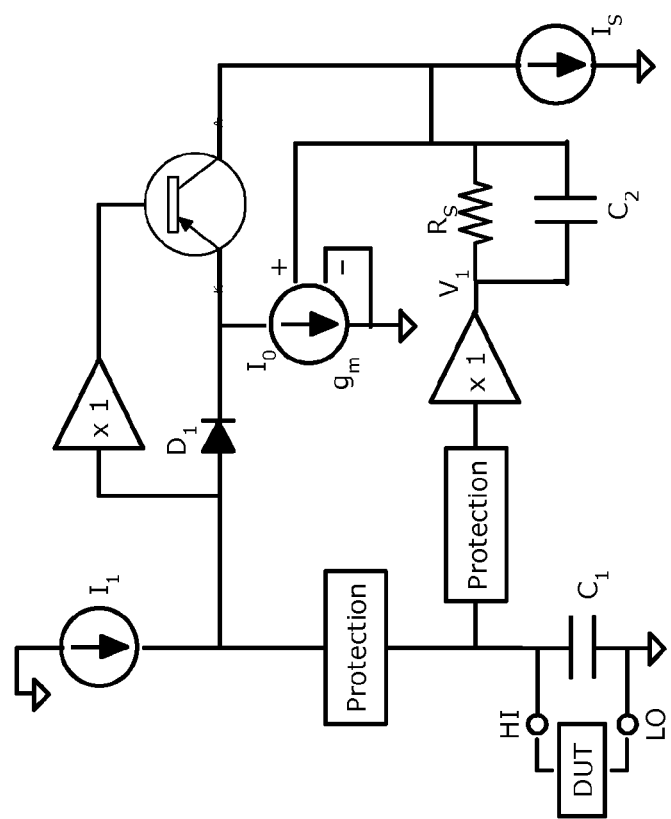
FIG. 3 is a block diagram illustrating an alternative example of a voltage clamp circuit coupled with a DUT in accordance with certain embodiments of the disclosed technology.

FIG. 3 is a block diagram illustrating an alternative example of a voltage clamp circuit 300 coupled with a DUT in accordance with certain embodiments of the disclosed technology. In the example 300, the clamp voltage for $V_1$ is $I_s * R_s$.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

I claim:
1. A voltage clamp circuit, comprising:
a first current source;
a second current source;
a voltage-controlled current source;
a first diode electrically coupled between the first current source and the voltage-controlled current source;

a second diode electrically coupled between the second current source and the voltage-controlled current source;

a first protection device electrically coupled between the first current source and an input node configured to be electrically coupled with a first port of a device under test (DUT); and a second protection device electrically coupled between the second current source and the input node, wherein the second protection circuit is also electrically coupled between the voltage-controlled current source and the input node.

2. The circuit of claim 1, further comprising a first resistance electrically coupled between the voltage-controlled current source and the second protection device.

3. The circuit of claim 2, further comprising a second resistance electrically coupled between the first resistance and the second current source, wherein the second resistance is also electrically coupled between the voltage-controlled current source and the second current source.

4. The circuit of claim 3, further comprising a third resistance electrically coupled between the first current source and the second current source.

5. The circuit of claim 4, further comprising a first capacitance electrically coupled between the first current source and the second current source.

6. The circuit of claim 5, further comprising a second capacitance electrically coupled between the first protection device and ground, wherein the second capacitance is also electrically coupled between the second protection device and ground.

7. The circuit of claim 6, further comprising a differencing device, the differencing device including:
   a first input electrically coupled with the first current source;
   a second input electrically coupled with the second current source; and
   an output electrically coupled with the second resistance.

8. The circuit of claim 7, further comprising a ground node configured to be electrically coupled with a second port of the DUT.

9. The circuit of claim 8, wherein the second capacitance is also electrically coupled between the input node and the ground node.

10. The circuit of claim 9, further comprising a first amplifier electrically coupled between the first current source and the differencing device.

11. The circuit of claim 10, further comprising a second amplifier electrically coupled between the second protection device and the first resistance.

12. A voltage clamp circuit, comprising:
    a first output node configured to be electrically coupled with a first port of a device under test (DUT);
    a second output node configured to be electrically coupled with a second port of the DUT;
    a first current source connected to the first output node;
    a second current source connected to the second output node, the second current source having a polarity that is opposite a polarity of the first current source;
    a voltage-controlled current source;
    circuitry configured to couple the voltage-controlled current source to the first current source when a polarity of the voltage-controlled current source is opposite the polarity of the first current source;
    circuitry configured to couple the voltage-controlled current source to the second current source when the polarity of the voltage-controlled current source at is opposite the polarity of the second current source;
    a resistor connected to the second current source and configured to conduct current from the second current source and current from the voltage-controlled current source when the polarity of the voltage-controlled current source is opposite the polarity of the second current source; and
    circuitry configured to drive the voltage input of the voltage controlled current source with a difference of the voltage across the resistor and the voltage across the first and second output nodes.

13. The voltage clamp circuit of claim 12, further comprising:
    a first protection device electrically coupled between the first current source and the first output node; and
    a second protection device electrically coupled between the second current source and the first output node, wherein the second protection circuit is also electrically coupled between the voltage-controlled current source and the first output node.

* * * * *